United States Patent
Lange et al.

(10) Patent No.: US 10,256,748 B2
(45) Date of Patent: Apr. 9, 2019

(54) ELECTROSTATIC ACTUATOR AND METHOD FOR PRODUCING THE SAME

(71) Applicant: Fraunhofer-Gesellschaft zur Foerderung der angewandten Forschung e.V., Munich (DE)

(72) Inventors: Nicolas Lange, Jena (DE); Frank Wippermann, Meiningen (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 789 days.

(21) Appl. No.: 14/952,752

(22) Filed: Nov. 25, 2015

(65) Prior Publication Data

US 2016/0079884 A1     Mar. 17, 2016

Related U.S. Application Data

(63) Continuation of application No. PCT/EP2014/060849, filed on May 26, 2014.

(30) Foreign Application Priority Data

May 27, 2013  (DE) .......... 10 2013 209 804

(51) Int. Cl.
| | |
|---|---|
| *H02N 11/00* | (2006.01) |
| *H02N 1/00* | (2006.01) |
| *H02N 2/00* | (2006.01) |
| *H01L 41/04* | (2006.01) |
| *B81B 3/00* | (2006.01) |

(52) U.S. Cl.
CPC .......... *H02N 1/006* (2013.01); *B81B 3/0086* (2013.01); *B81B 2201/038* (2013.01); *B81B 2203/019* (2013.01); *B81B 2203/04* (2013.01); *B81B 2203/058* (2013.01)

(58) Field of Classification Search
CPC .......... H02N 1/00; H02N 11/00; H01L 41/04
USPC .......... 310/300, 309, 330, 363, 365
See application file for complete search history.

(56) References Cited

U.S. PATENT DOCUMENTS

| | | | |
|---|---|---|---|
| 6,263,736 B1 * | 7/2001 | Thundat ........... | G01H 1/14 310/309 |
| 6,461,337 B1 | 10/2002 | Minotti et al. | |
| 6,817,702 B2 | 11/2004 | Delametter et al. | |
| 7,498,715 B2 * | 3/2009 | Yang ........... | H02N 1/004 310/309 |
| 2002/0012490 A1 * | 1/2002 | Farmer, III ........... | G02B 26/001 385/18 |
| 2002/0113281 A1 | 8/2002 | Cunningham et al. | |
| 2003/0058069 A1 * | 3/2003 | Schwartz ........... | H01H 59/0009 335/78 |

(Continued)

FOREIGN PATENT DOCUMENTS

| | | |
|---|---|---|
| CN | 1961244 A | 5/2007 |
| CN | 101388618 A | 3/2009 |

(Continued)

*Primary Examiner* — Jose Gonzalez Quinone
(74) *Attorney, Agent, or Firm* — Perkins Coie LLP; Michael Glenn

(57) ABSTRACT

An electrostatic actuator having a stationary electrode and a fixedly cantilevered bender is described, wherein the bender includes a cantilever electrode disposed opposite to the stationary electrode in an overlapping area and being deflectable in the direction of the stationary electrode.

17 Claims, 17 Drawing Sheets

(56) References Cited

U.S. PATENT DOCUMENTS

| | | |
|---|---|---|
| 2003/0173647 A1 | 9/2003 | Montelius et al. |
| 2003/0202738 A1* | 10/2003 | Dunec .................... G02B 6/352 385/18 |
| 2004/0017644 A1* | 1/2004 | Goodwin-Johansson .................... H01H 59/0009 361/233 |
| 2004/0056742 A1* | 3/2004 | Dabbaj .................. H02N 1/006 335/78 |
| 2004/0145277 A1 | 7/2004 | Horning et al. |
| 2005/0162040 A1 | 7/2005 | Robert et al. |
| 2007/0120438 A1 | 5/2007 | Divoux et al. |
| 2008/0074006 A1 | 3/2008 | Kawakubo et al. |
| 2008/0123171 A1 | 5/2008 | Dausch et al. |
| 2009/0051243 A1 | 2/2009 | Horng et al. |
| 2010/0181866 A1 | 7/2010 | DeReus |
| 2012/0043857 A1* | 2/2012 | Ueda .................... H01L 41/042 310/330 |

FOREIGN PATENT DOCUMENTS

| | | |
|---|---|---|
| CN | 101420188 A | 4/2009 |
| CN | 102739104 A | 10/2012 |
| DE | 69812408 T2 | 1/2004 |
| DE | 102007048593 A1 | 2/2009 |
| DE | 102010013611 A1 | 9/2011 |
| WO | 2005059933 A1 | 6/2005 |
| WO | 2010083520 A1 | 7/2010 |

\* cited by examiner

ELECTROSTATIC ACTUATOR AND METHOD FOR PRODUCING THE SAME

CROSS-REFERENCE TO RELATED APPLICATIONS

This application is a continuation of copending International Application No. PCT/EP2014/060849, filed May 26, 2014, which is incorporated herein by reference in its entirety, and additionally claims priority from German Application No. 10 2013 209 804.9, filed May 27, 2013, which is also incorporated herein by reference in its entirety.

BACKGROUND OF THE INVENTION

The present invention relates to an electrostatic actuator having a cantilever electrode and a method for producing the same.

Normally, an electrostatic actuator is structured as follows, here described exemplarily from a bottom to a top in the following order: a fixed or movable first electrode is disposed on a first actuator material and covered by an isolation layer. On the latter, a sacrificial layer is disposed, which is again covered by a fixed or movable second electrode. A second actuator material is disposed on the second electrode. The material of the electrodes can differ from the actuator material, both in the first and the second electrode, wherein also the first actuator material can differ from the second actuator material, in particular, the first or second actuator material can be a substrate on which the actuator is formed in an unmovable manner. After the layers and electrodes are joined, the sacrificial layer is removed, whereupon a gap remains between the electrodes within the structure.

Common production processes of electrostatic actuators result in an air gap between the two electrodes of an electrostatic actuator, among others due to the introduced sacrificial layers. The distance between the electrodes resulting from the gap leads, on the one hand, to a significant increase of the electric voltage necessitated for operating the actuator, on the other hand to a change in the deflection behavior of the actuator in dependence on the currently obtained deflection state, up to the "pull-in" effect.

The generated force of an electrostatic actuator decreases quadratically with an increasing distance of the electrodes to one another. The force of the electrostatic actuator for the case of the classical parallel-plate actuator can be given, by neglecting the isolation layer, by the equation $$F = \frac{1}{2}(e_0 A V^2)/(g-d)^2,$$

wherein F describes the electrostatic force, $e_0$ the electric field constant, V the applied voltage, d the voltage-dependent deflection, A the capacitor area and g the initial distance of the electrodes to one another. Due to the geometry of the electrostatic actuator and the highly nonlinear force generation, depending quadratically on the distance of the electrodes to one another with the ratio $$\frac{1}{(g-d)^2},$$

the efficiency of an electrostatic actuator significantly decreases with increasing distance of the electrodes to one another. In the case of a parallel-plate actuator, this distance is the maximum possible travel.

FIG. 3a shows a side view of an electrostatic actuator according to conventional technology, wherein a stationary electrode 14 is disposed on a substrate 12, and an isolation layer 16 is disposed on a side of the stationary electrode 14 facing away from the substrate 12. Opposite to the stationary electrode 14, a bender 32 fixed in a fixed clamping 18 is disposed. A movable electrode 34 is disposed on a side of the bender 32 facing the stationary electrode 14, wherein a gap 17 is formed between the movable electrode 34 and the isolation layer 16, wherein the gap 17 is, for example, a result of removing a sacrificial layer which has been disposed during the above-described production process of the actuator.

That positioning of the two electrodes 13 and 34 to one another with the gap 17 formed between the electrodes 14 and 34 results in the above-described limitations of the actuator.

FIG. 3b shows a top view of the electrostatic actuator of FIG. 3a. The bender 32 disposed on the fixed clamping 18 is implemented in a planar uniform manner.

Both the gap 17 between the electrodes 14 and 34 and the nonlinear force generation result in a pull-in effect when exceeding a control voltage between electrodes 14 and 34 depending on geometry and material parameters.

Due to production-induced limitations, the gap 17 between the electrodes 14 and 34 cannot be completely closed, but is minimized by means of optimizing the production process. Thereby, the loss of electrostatically generatable and usable force caused by the remaining distance of the electrodes 14 and 34 to one another is accepted.

Conventional technology includes a great number of different configurations of electrostatic actuators. Known realizations show, for example, benders or plates that are cantilevered via a spring element or clamped on both sides by fixed clampings or spring elements. Also concerning the geometry of stationary electrode or bender, a great number of different realizations is known, wherein the gap between the electrodes leads to the above described disadvantages in the realizations.

Publications describe how the gap between the electrodes can be partially closed by means of a very soft tab contained by the bender by electrostatic excitation very early, i.e. already at a very low applied electric voltage, by effecting deflection of the soft tab towards the opposing electrode by attractive force between the electrodes caused by the applied voltage, and the deflection partially closes a gap at a contact point. The gap itself, however, still remains.

SUMMARY

According to an embodiment, an electrostatic actuator may have: a stationary electrode; a fixedly cantilevered bender, wherein the bender includes a cantilever with a cantilever electrode disposed opposite to the stationary electrode in an overlapping area; wherein the cantilever includes, in an idle state, a first end disposed in the plane of the bender and a second end deflected out of a plane where the bender is disposed in the direction of the stationary electrode, to effect, when applying an electric field, a deformation of the cantilever electrode or the bender.

According to another embodiment, an apparatus may have: a first inventive electrostatic actuator; a second inventive electrostatic actuator, wherein the first and the second electrostatic actuators are disposed such that the deflectable ends of the benders are opposite; and a spring structure disposed between the deflectable ends of the benders and connecting the deflectable ends.

According to another embodiment, a method for producing an electrostatic actuator may have the steps of: disposing a stationary electrode; disposing a fixedly cantilevered bender; wherein the bender includes a cantilever with a cantilever electrode, which is disposed opposite to the stationary electrode in an overlapping area; wherein the cantilever comprises, in an idle state, a first end disposed in the plane of the bender and a second end deflected out of a plane where the bender is disposed in the direction of the stationary electrode, to effect, when applying an electric field, a deformation of the cantilever electrode or the bender.

The present invention is based on the knowledge that the above-described problems are prevented by partially closing the gap between the electrodes by means of mechanical preload. Additionally, by disposing a cantilever electrode, influencing the characteristic curve between applied electric voltage and resulting actuator travel can be obtained.

Production-induced tensions in the material of the bender can be realized, for example, during lithography processes and are used for deflecting the cantilever with respect to the bender. By a slightly amended geometry and mechanical tension gradient, differently curved areas can be generated within an actuator. If the same are synchronized, the gap between the electrodes can be partially closed at a contact point and/or additional spring elements can be generated. The additional spring elements can be used, for example, for linearizing the force-deflection curve of electrostatic actuators by the opposing forces adapted by means of the spring elements.

A further and much more reliable and also technologically simpler option for adapting the deflection curve is the adaption of the electrode shape in order to adjust, by means of a locally varying electrode formation, a locally varying actuating power and hence an adapted deflection curve.

According to an embodiment, a bender includes a cantilever electrode deflected in the direction of a stationary electrode, such that the cantilever electrode touches an isolation layer disposed on a stationary electrode and thus partially closes the gap between the electrodes, for example exposed by removing a sacrificial layer, at a contact point between cantilever electrode and stationary electrode. Thereby, when applying an electric voltage between the electrodes, high attractive forces are generated and deflection of the bender is enabled already at low electric voltages.

According to an alternative embodiment, the bender is curved along an axial expansion, such that a distance between the bender and the stationary electrode along the curvature and starting from the clamping of the bender increases. This arrangement allows an increased travel of the actuator between a deflectable end and the stationary electrode.

According to a further embodiment, two electrostatic actuators are disposed such that the deflectable ends of the benders are opposite to one another and a spring structure is disposed between the deflectable ends, which generates a restoring force with respect to an electrostatic force deflecting the actuator. Thereby, the voltage deflection behavior can be additionally influenced.

According to a further embodiment, a beam element is disposed on the freely deflectable end of the bender, which increases the travel of the electrostatic actuator with a levering effect.

BRIEF DESCRIPTION OF THE DRAWINGS

Embodiments of the present invention will be detailed subsequently referring to the appended drawings, in which:

FIG. 1b is a top view of the electrostatic actuator of FIG. 1a;

FIG. 3b is a top view of the electrostatic actuator of FIG. 3a;

FIG. 4b is a top view of the electrostatic actuator of FIG. 4a;

FIG. 7b is a top view of the electrostatic actuator of FIG. 7a;

FIG. 9a is a side view of an electrostatic actuator having a pre-curvature and cantilever electrode according to FIG. 4a;

FIG. 10b is a side view of the electrostatic actuator of FIG. 10a;

DETAILED DESCRIPTION OF THE INVENTION

Figure 1A:
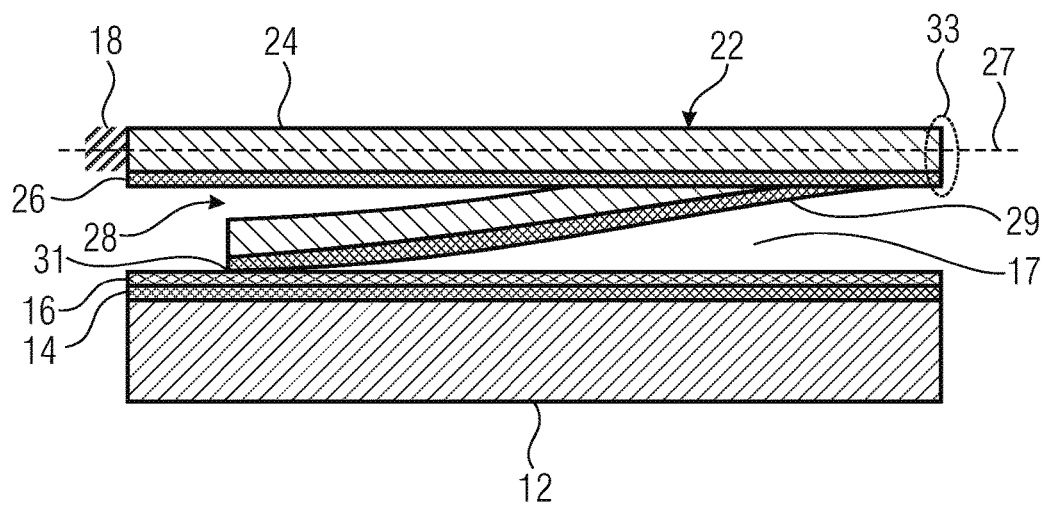
FIG. 1a is a side view of an electrostatic actuator whose bender includes a cantilever electrode which is deflected in the direction of the stationary electrode and closes a gap between the electrodes, with the exception of an isolation layer.

FIG. 1a shows a side view of an apparatus 10 having an electrostatic actuator. A stationary electrode 14 which is covered in a planar manner by an isolation layer 16 is disposed on a substrate 12. Opposite to the stationary electrode 14, spaced apart by a gap 17, a bender 22 disposed on a fixed clamping 18 is arranged, wherein the bender includes a deformable actuator material 24 and a bender electrode 26 disposed thereon. A neutral fiber 27 of the bender 22 runs parallel to the stationary electrode 14. An area of the bender 22 defines a cantilever 28 and is deflected in the direction of the stationary electrode 14, wherein a cantilever electrode 29 that is electrically isolated from the bender electrode 26 is disposed on the surface of the cantilever 28 facing the stationary electrode 14, such that a differing electric potential can be applied between bender electrode 26 and cantilever electrode 29. In the idle state, without the application of an electric field, the cantilever 28 is pre-deflected such that the cantilever electrode 29 touches the isolation layer 16 at a contact point 31 and partially closes the gap 17 between the cantilever electrode 29 and the stationary electrode 14 at this contact point 31. Via an axial curve of the bender from the fixed clamping 18 towards a deflectable end 33 opposing a clamped side of the bender, the bender 22 comprises, with the exception of the cantilever electrode 29, in the idle state and hence without the application of an electric field, an almost constant distance between the bender and the isolation layer 16 and hence the stationary electrode 14, wherein the gap 17 is formed within that distance.

Figure 1B:
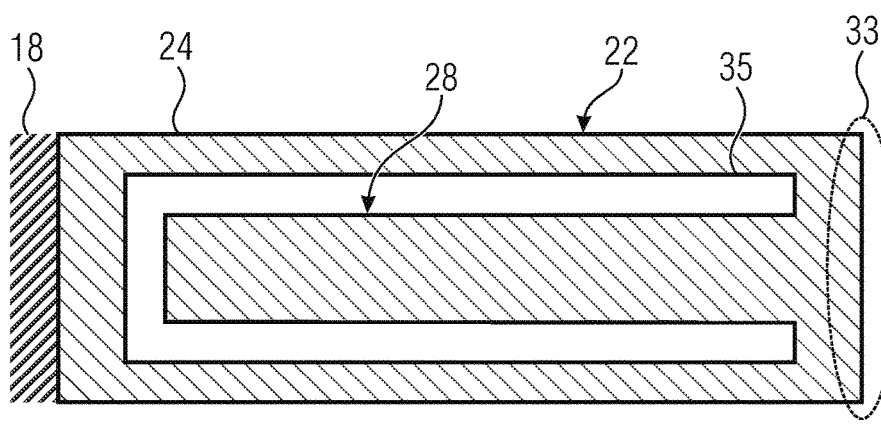
Figure 2:
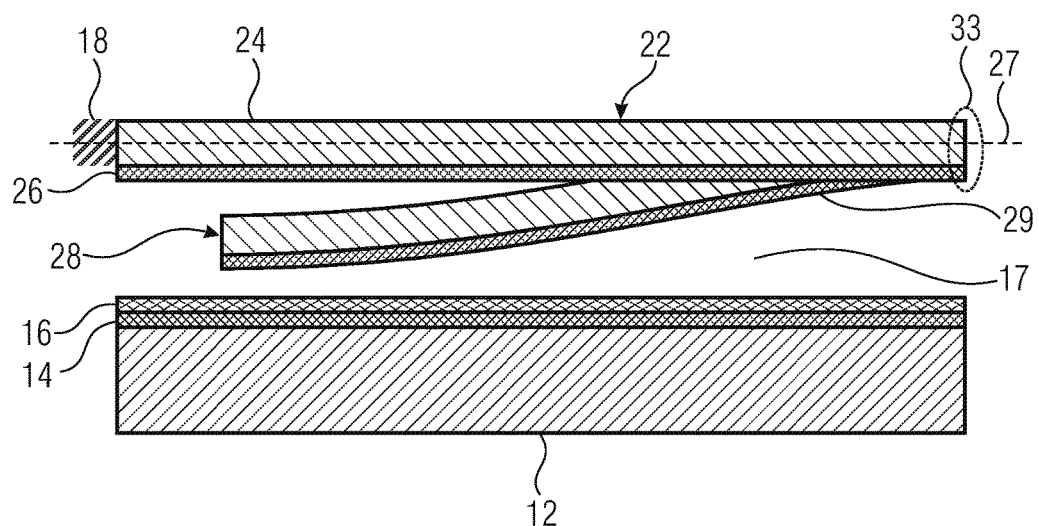
FIG. 2 is a side view of an electrostatic actuator analogous to FIG. 1a, wherein the cantilever electrode is deflected in the direction of the stationary electrode and partially reduces the gap between the electrodes.

FIG. 1b shows a top view of the apparatus of FIG. 1a. At its clamped ends, the bender 22 is clamped in a fixed manner via a lateral expansion of a whole width of the bender 22. The bender 22 includes a recess 34 which forms the cantilever 28 such that a transition from cantilever 28 to bender 22 is disposed adjacent to the deflectable end of the bender 22, such that, as shown in FIG. 1a, the cantilever 28 is deflected, at a side facing the clamping 18, from a plane where the bender is disposed in the direction of the stationary electrode. The recess 35 can be realized during a production process or by not forming the bender at the locations of the recess 35 or by subsequently removing material.

Apart from partially closing the gap 17 between the cantilever electrode 29 and the stationary electrode 14 at the contact point 31, which reduces the tension necessitated for deflecting the deflectable end of the bender, the proximity between cantilever electrode 29 and electrode 14 causes increased force generation between the bender 22 and the stationary electrode 14, which increases a useful travel of the bender 22 and hence the actuator and reduces the necessitated control voltage. Further, the geometry of the cantilever, adaptation of the deflection behavior can take place and the maximum travel to the pull-in effect, which has the effect that the bender 22 is abruptly deflected in a direction of the stationary electrode 14, can be influenced. By adapting the production parameters and by means of a slightly different geometry of the electrodes 14, 26 and 29 in connection with a mechanical preload moving the cantilever electrode 29 towards the stationary electrode, the gap between the two electrodes 14 and 29 is closed such that merely the isolation layer is disposed between the electrodes 14 and 29 for avoiding short circuits. Thus, deflection of the actuator is also possible at low electric voltages.

The current production processes are only slightly changed for implementing the electrostatic actuator having a cantilever electrode. The cantilever is deflected in a direction perpendicular to a production plane running parallel to the plane of the stationary electrode 14, whereby the gap 17 between the electrodes 14 and 29 at the contact point 31 is partially closed and hence the performance is significantly improved.

A suitable adaptation of geometry, position or basic design of the cantilever 28 or the cantilever electrode 2 additionally enables adjustment of a ratio of the voltage applied to the electrodes 14, 26 or 29 and the deflection of the actuator, in particular a linearization of this ratio. In polymer-based electrostatic actuators, this can take place by a slight adaptation of the production parameters. Here, the fact that the cantilever 28 approximating the stationary electrode 14 generates an increased electrostatic force is used, wherein this force is defined by the geometry of the cantilever 28 and/or the cantilever electrode 28 as well as the stationary electrode 34 in order to reduce the necessitated supply voltage or to prevent the pull-in effect, wherein the geometries can also be implemented to adjust a linearized ratio between voltage applied to the actuators and resulting actuator travel. Here, all electrodes 26 and 29 can also be controlled separately or, alternatively, the same can be connected to one another.

The cantilever 28 includes the cantilever electrode 29, which can be both connected to the bender electrode 29 comprised by the bender 22 but can also be controlled separately. The deflection curve of the electrostatic actuator can be adapted in dependence on position and design of the cantilever or the cantilevers in dependence on the demands on the actuator, as will be discussed in embodiments below. The opposing force generated by the pre-deflection with respect to the stationary electrode can be used as mechanical resistance or spring element or, with electric excitation, as additional attracting element.

In alternative embodiments, the bender electrode and the cantilever electrode are formed integrally, such that applying an electric voltage to the bender or cantilever electrode also results in applying the electric voltage to the respective other electrode.

According to alternative embodiments, the actuator material or substrate is formed integrally with the bender electrode and/or the cantilever electrode, such that, for example, a planar portion of a conductive material is disposed on the fixed clamping and comprises the cantilever.

Embodiments include several such structures, including self-supporting and/or clamped bending beams, ridges, spring elements and cantilevers. Further, embodiments show an arrangement of several such structures in one apparatus, wherein their arrangement can basically be side-by-side, parallel, radial or as smaller elements within greater systems.

Figure 3A:
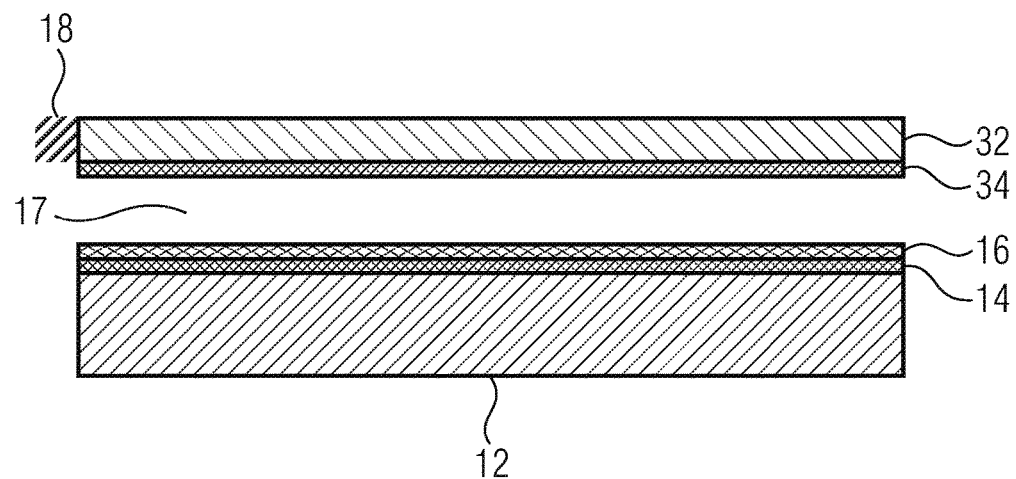
FIG. 3a is a side view of an electrostatic actuator according to conventional technology without cantilever electrode.
Figure 3B:
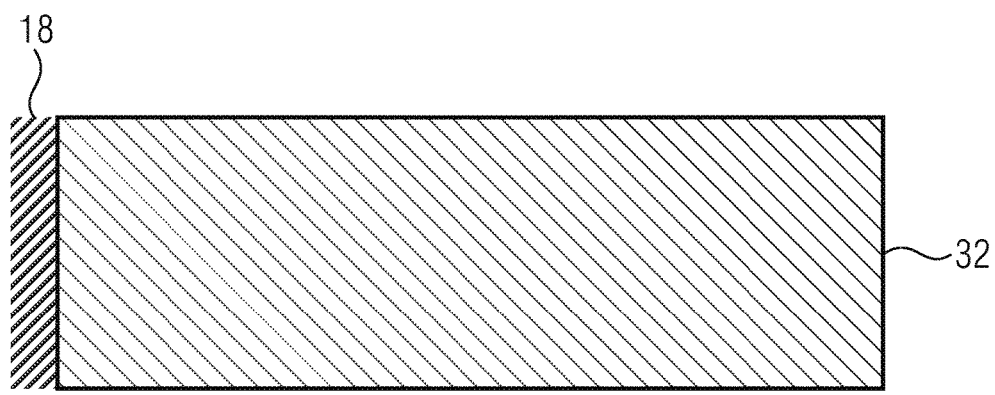

FIG. 3 shows a side view of an electrostatic actuator analogous to FIG. 1a, wherein the cantilever 28 is deflected in the direction of the stationary electrode 14, such that the gap 17 is partially reduced across the axial expansion of the bender and the cantilever 28 is disposed spaced-apart from the isolation layer 16 in an electric voltage-free state.

Depending on the arrangement or deflection of the cantilever with respect to the stationary electrode, the gap between cantilever and stationary electrode can be partially reduced or partially closed. An increasing reduction of the gap results in an increasing reduction of the electric voltage necessitated for deflecting the electrostatic actuator, such that a deflection behavior of the electrostatic actuator can be influenced by the partial reduction or partial closure of the gap.

Figure 4A:
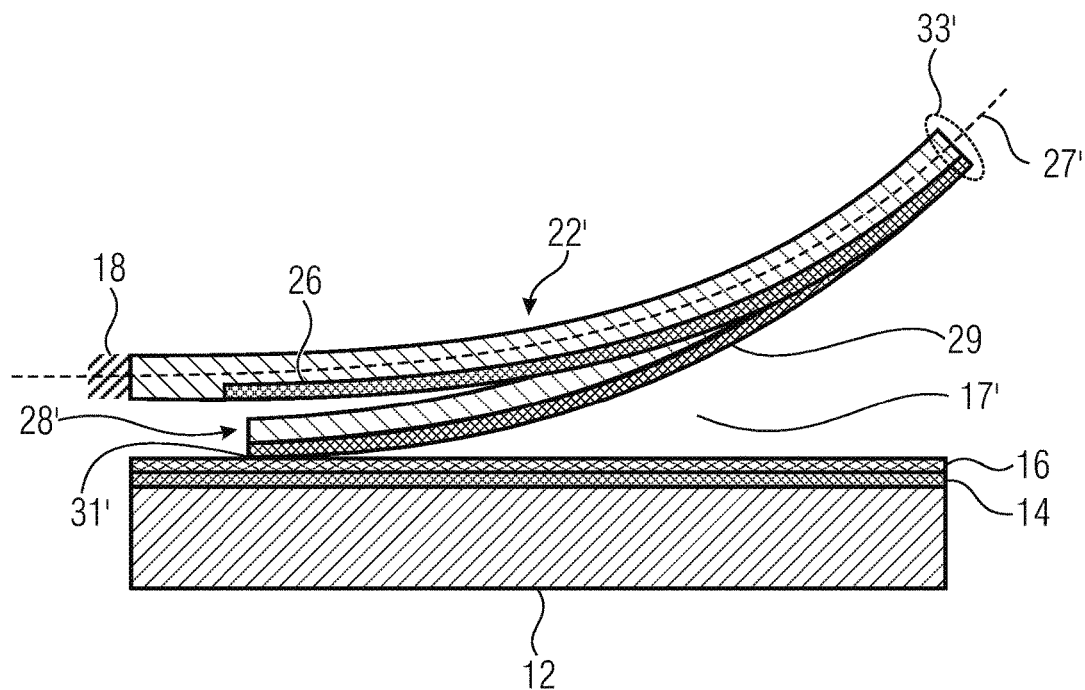
FIG. 4a is an electrostatic actuator analogous to FIG. 1a, wherein the bender includes a mechanical preload, such that the bender comprises a curvature.

FIG. 4a shows a side view of an electrostatic actuator analogous to FIG. 1a, wherein a bender 22', in contrast to the bender 22 of FIG. 1, is mechanically preloaded such that a deflectable end 33' disposed opposite to the fixed clamping 18 is deflected facing away from the stationary electrode 14. Thus, the plane where a neutral fiber 27' of the bender 22' is disposed, includes a curvature. A cantilever 28' included by the bender 22' and defined by a recess 35' has, analogous to the cantilever 28 of FIG. 1, a voltage gradient and hence a mechanical preload with respect to the bender 22' such that a gap 17' between the cantilever electrode 29 and the stationary electrode 14 in the idle state, and hence without the application of an electric field, is partially closed, such that merely the isolation layer 16 is disposed between the electrodes 14 and 29 at a contact point 31'.

The mechanical preload of the bender 22' results in a distance between the deflectable end 33' and the stationary electrode 14 which is enlarged with respect to FIG. 1, and hence to an increased useful travel of the actuator. At the same time, the bender 22' additionally includes a restoring force by the cantilever 28'.

Figure 4B:
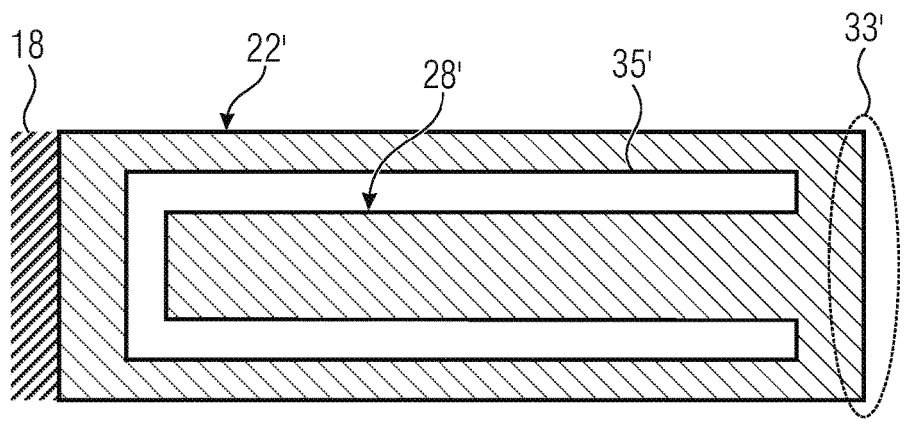

FIG. 4b shows a top view of the electrostatic actuator of FIG. 4a. The top view is identical to FIG. 1b, since the mechanical preloads of the bender 22' disposed on the fixed clamping 18 and the cantilever 28' result in a curvature of the bender 22' and the cantilever 28' in the direction of the viewer, such that the top view remains unchanged.

FIGS. 5a-d each show different possible implementations of a cantilever defined by a recess and comprised by a bender 56.

Figure 5A:
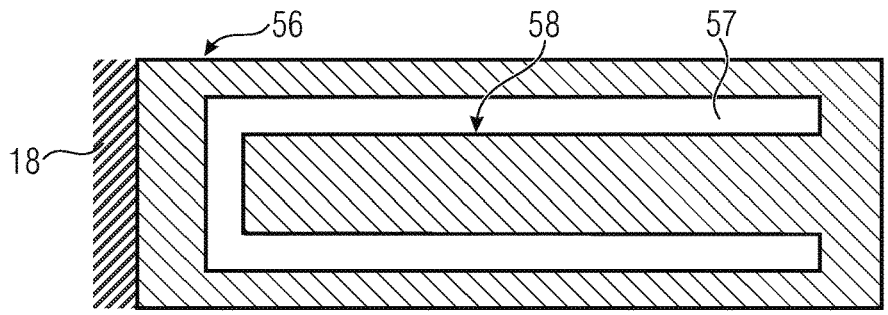
FIG. 5a is a top view of an electrostatic actuator having a square cantilever.

FIG. 5a shows a cantilever 58, which is formed, analogous to the above embodiments, in a square manner by a recess 57 and includes a deflectable end disposed adjacent to the fixed clamping 18.

Figure 5B:
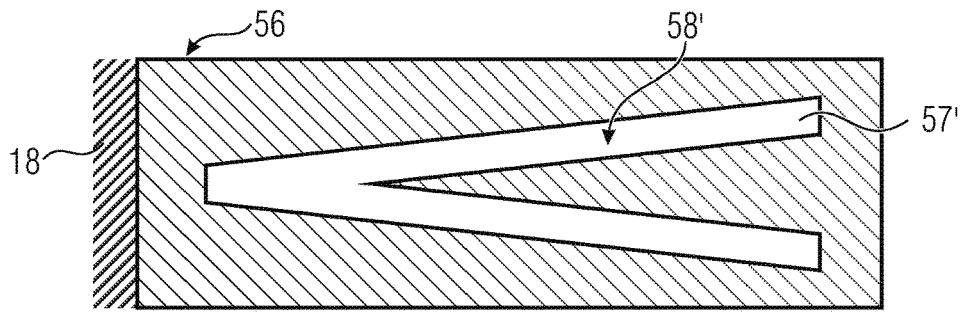
FIG. 5b is a top view of an electrostatic actuator having a triangular cantilever.

FIG. 5b shows an alternative cantilever 58', which is formed in a triangular manner by the recess 27', wherein the cantilever 58' tapers from a deflectable end towards a fixed end opposing and adjacent to the fixed clamping 18. Such an implementation has the effect that both the mechanical force between the cantilever 58' and the stationary electrode is adjusted along the curve of the cantilever 58', and that the force induced by applying an electric voltage between cantilever electrode and stationary electrode is defined between cantilever 58' and/or bender 56 with respect to the stationary electrode by the geometry of the recess 57' and hence the cantilever 58'. A tapering cantilever 58' has, at the tapered end, less rigidity and hence a lower restoring force. At the same time, the area where cantilever electrode and stationary electrode oppose one another also tapers, such that, at the tapered positions, the attracting force between the electrodes is lower.

Figure 5C:
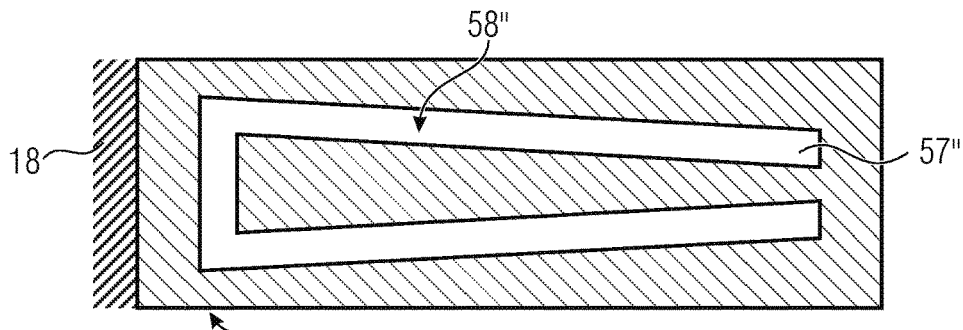
FIG. 5c is a top view of an electrostatic actuator having a trapezoidal cantilever.

FIG. 5c shows the bender 56 with a cantilever 58" formed in a trapezoidal manner, wherein the cantilever 58" tapers starting from the unmovable end disposed on the fixed clamping 18 towards an opposed deflectable end.

Figure 5D:
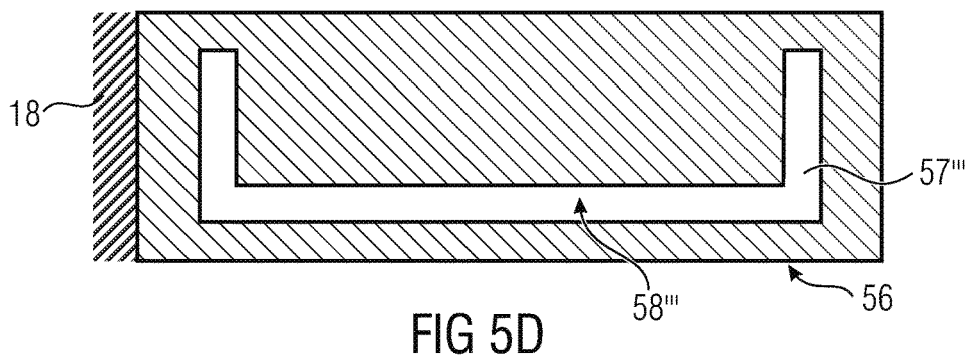
FIG. 5d is a top view of an electrostatic actuator having a rectangular cantilever whose deflectable end runs along the axial curve of the bender.

In FIG. 5d, a cantilever 58'" also has a rectangular shape, but is oriented such with respect to FIGS. 5a-c that a deflectable end of the cantilever 58'" runs along a direction from the fixedly clamped end disposed adjacent to the fixed clamping 18 towards the opposing deflectable end, such that the cantilever is rotated by 90° with respect to FIGS. 5a-c and a contact point between the cantilever 58'" and the stationary electrode or the isolation layer runs along the axial curve of the stationary electrode, as an alternative to the above embodiment.

Basically, any implementation of a cantilever within the bender can be realized. The orientation and geometry of a cantilever is adapted to the demands of the respective following application. A cantilever without electrostatic function, for example due to non-contacting or non-application of an electric voltage to the electrode, allows the usage of a cantilever as a spring element for adapting the deflection curve of the electrostatic actuator to defined demands by the geometry and material selection, in that the cantilever is implemented in its position, length, geometry and/or mechanical preload according to the defined demands.

An adaption of the electrode geometry described in FIGS. 5a-d results in a change in capacitance during bender actuation. Deflection of the actuators results in a decreasing distance between cantilever and stationary electrode, wherein a change in capacitance is triggered by the variable distance, whereby the actuator additionally shows nonlinear deflection behavior. This nonlinear deflection behavior can be adjusted by geometric adaptation of the cantilever and/or stationary electrode, for example for adjusting a linear curve of the change in capacitance or a constant curve of the capacitance. By adapting the electrode shape, the deflection behavior of the actuator can be influenced, and additionally, the pull-in effect can be completely prevented. Thus, the electrode shape is adapted to the change in capacitance of the actuator with increasing deflection.

Figure 6A:
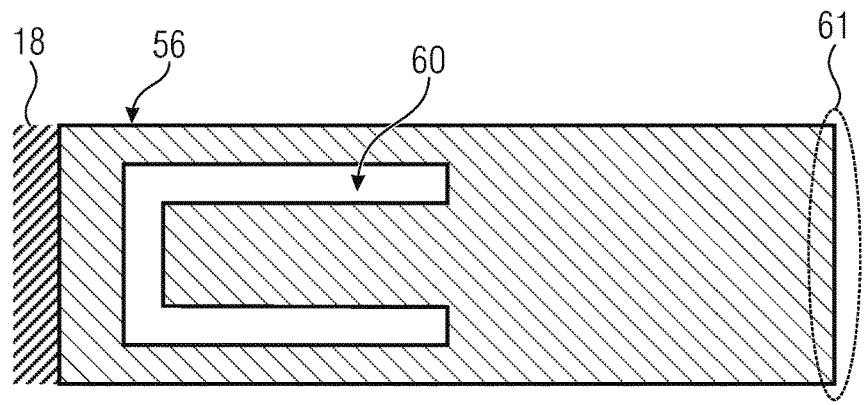
FIG. 6a is a top view of an electrostatic actuator analogous to FIG. 5a having a reduced cantilever which is disposed adjacent to the fixed clamping.

FIG. 6a shows a top view of the bender 56 of FIG. 5a with a deflectable end 61, and an alternative cantilever 60 which is reduced compared to the cantilever 58 of FIG. 5a. The cantilever 60 is disposed adjacent to the firmly clamped end of the bender 56.

Figure 6B:
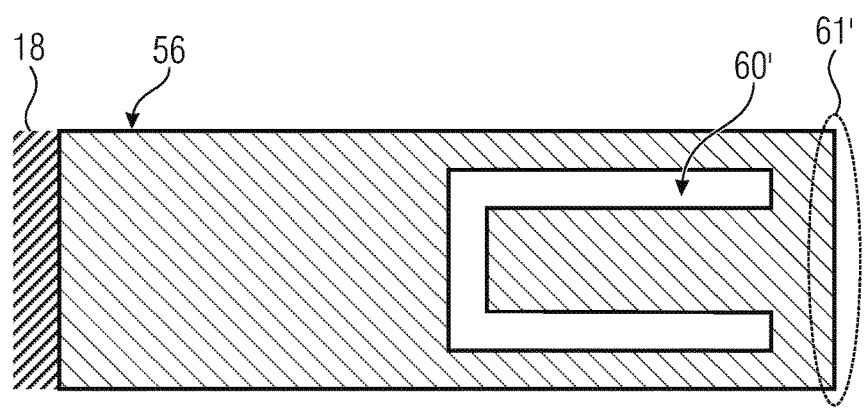
FIG. 6b is a top view of an electrostatic actuator analogous to FIG. 6a, having a reduced cantilever disposed adjacent to the deflectable end of the bender.

FIG. 6b shows a top view of the bender 56 with a cantilever 60' analogous to the cantilever 60 of FIG. 6a, wherein the cantilever 60' is disposed adjacent to the deflectable end 61' of the bender 56.

Figure 6C:
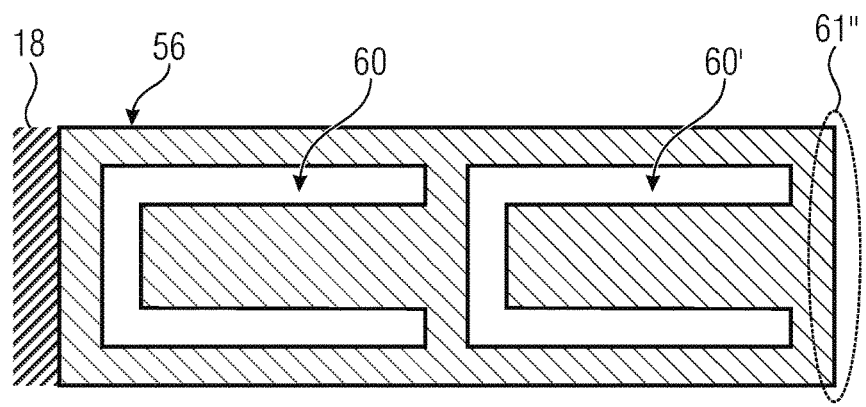
FIG. 6c is a top view of an electrostatic actuator having one cantilever each analogous to FIG. 6a and FIG. 6b.

FIG. 6c shows a top view of the bender 56 including a cantilever 60 analogous to FIG. 6a and a cantilever 60' analogous to FIG. 5b, such that two cantilevers 60 and 60' are comprised by the bender 56, whose electrodes disposed thereon can be controlled separately according to the above embodiments. Alternatively or additionally, the two cantilevers 60 and 60' can also include differing mechanical preloads for realizing different forces and distances between bender and stationary electrode.

Alternative embodiments include cantilevers having any amount of equally or differently formed cantilevers.

Basically, several electrodes comprised by a bender can be implemented electrically separated or separately controllable or electrically connected and hence commonly controllable.

FIG. 7 shows an apparatus 20 including two electrostatic actuators according to FIG. 4 connected to one another via a spring element.

Figure 7A:
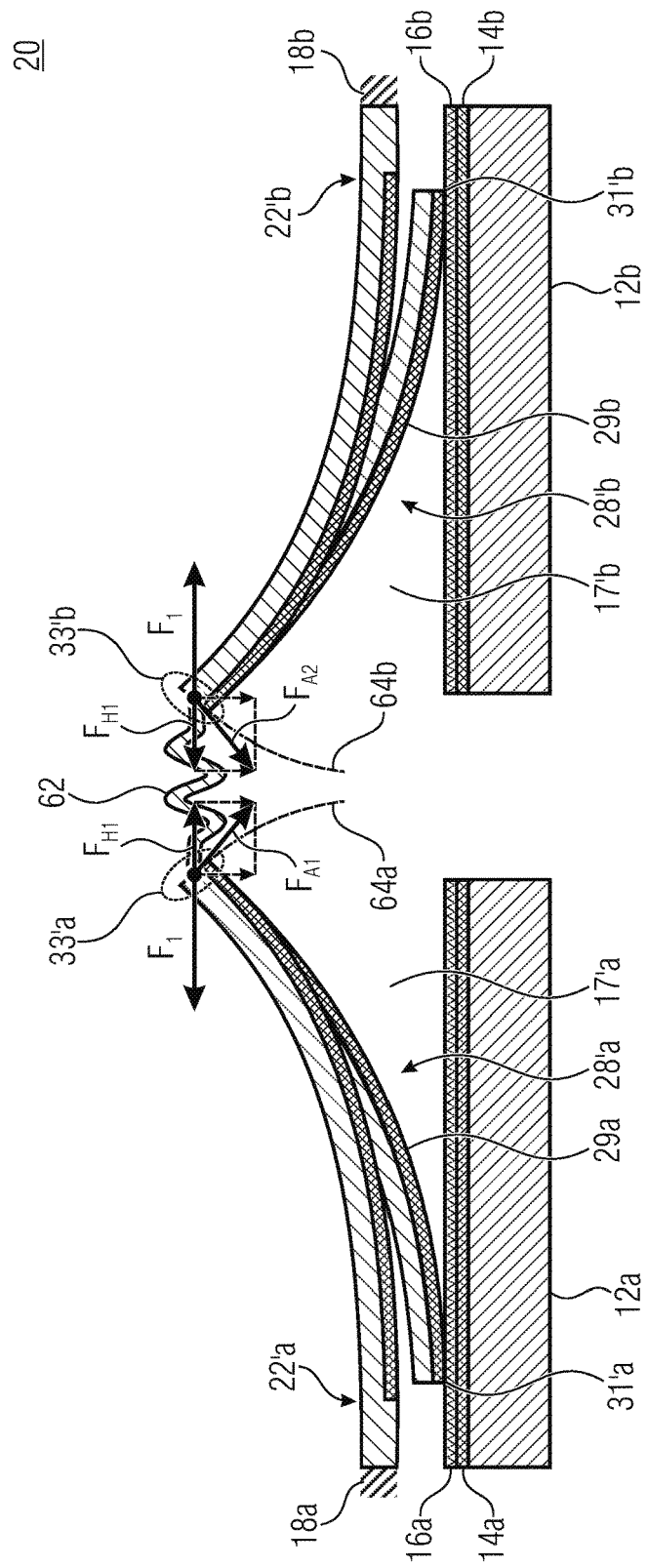
FIG. 7a is a side view of two opposing electrostatic actuators whose deflectable end is connected via a spring element.

FIG. 7a shows a side view of the apparatus 20 wherein the two electrostatic actuators are arranged to one another such that the two deflectable ends 33'a and 33'b of the benders 22'a and 22'b are opposite to one another. The spring element 62 is disposed such that the same connects the two deflectable ends 33'a and 33'b of benders 22'a and 22'b to one another. If one or two electrostatic actuators are controlled, the deflectable end 33'a of the bender 22'a moves along a path 64a and the deflectable end 33'b of the bender 22'b along a path 64b, wherein a distance between deflectable ends 33'a and 33'b of the benders 22'a and 22b reduces with simultaneous control. With increasingly reduced distance between the deflectable ends 33'a and 33'b of the benders 22'a and 22'b, the spring element 62 is increasingly compressed by a portion $F_{H1}$ or $F_{H2}$ of an actuator force $F_{A1}$ and $F_{A2}$ and causes a force $F_{H1}$ counteracting the deflection of benders 22'a and 22'b. With increasing deflection of the benders 22'a and 22'b, the force $F_1$ increases, such that a maximum deflection of benders 22'a and 22'b exists, which is limited by the opposing force $F_{H1}$ induced by the spring element 62, when the portion $F_{H1}$ or $F_{H2}$ is equal to the opposing force $F_1$ and an equilibrium of forces occurs.

By the arrangement of the spring element 62 and by limiting the travel of the actuators, the deflection behavior of the actuator is influenced in dependence on a spring constant or a spring geometry. By a nonlinear design of the spring constant or design of the spring constant defined by the spring geometry in dependence on demands resulting from the later application of the actuator, the pull-in effect can be completely prevented or can be adjusted such that the pull-in effect shows a previously defined operating point.

Figure 7B:
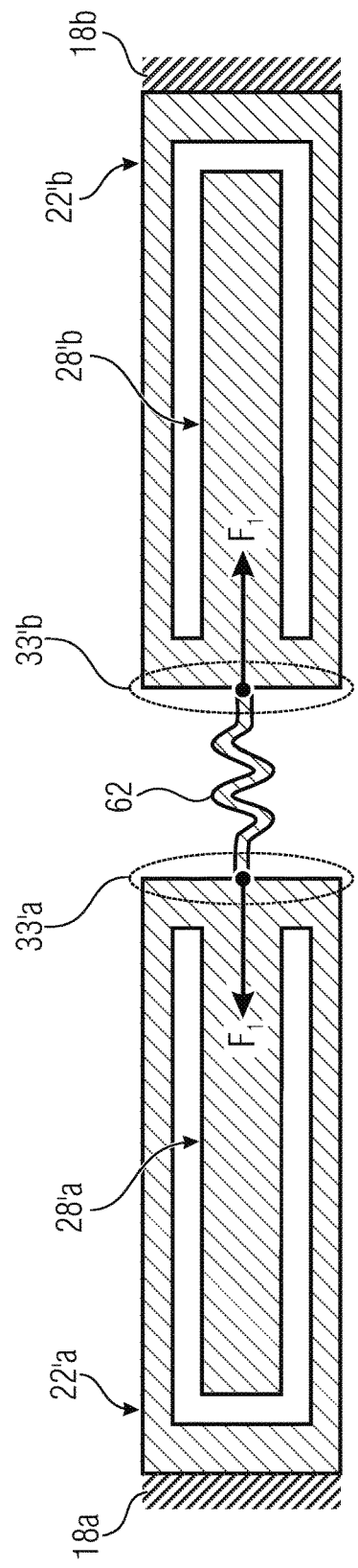

FIG. 7b shows a top view of the apparatus 20 of FIG. 7a. The spring element 62 is approximately arranged centrally along a lateral expansion of deflectable ends 33'a and 33'b of the benders 22'a and 22'b in order to reduce tilting of the bender 22'a with respect to the bender 22'b when compressing the spring element 62, resulting in the force $F_1$. In alternative embodiments, the spring element 62 is disposed such that predefined tilting of a bender with respect to another bender is obtained. In further embodiments, the spring element is disposed in a planar manner along the respective deflectable end of a bender such that the restoring force $F_1$ is also introduced in a planar manner.

In alternative embodiments, a spring element is disposed between benders such that a linearized ratio is adjusted between voltage applied to the electrodes and resulting actuator travel. Alternatively or additionally, occurrence of the pull-in effect can also be allowed.

In further embodiments, a functional element is disposed on the spring element, for example an optical structure which is moved together with the deflectable ends of the actuators and the spring element by deflecting at least one actuator in space.

Figure 8:
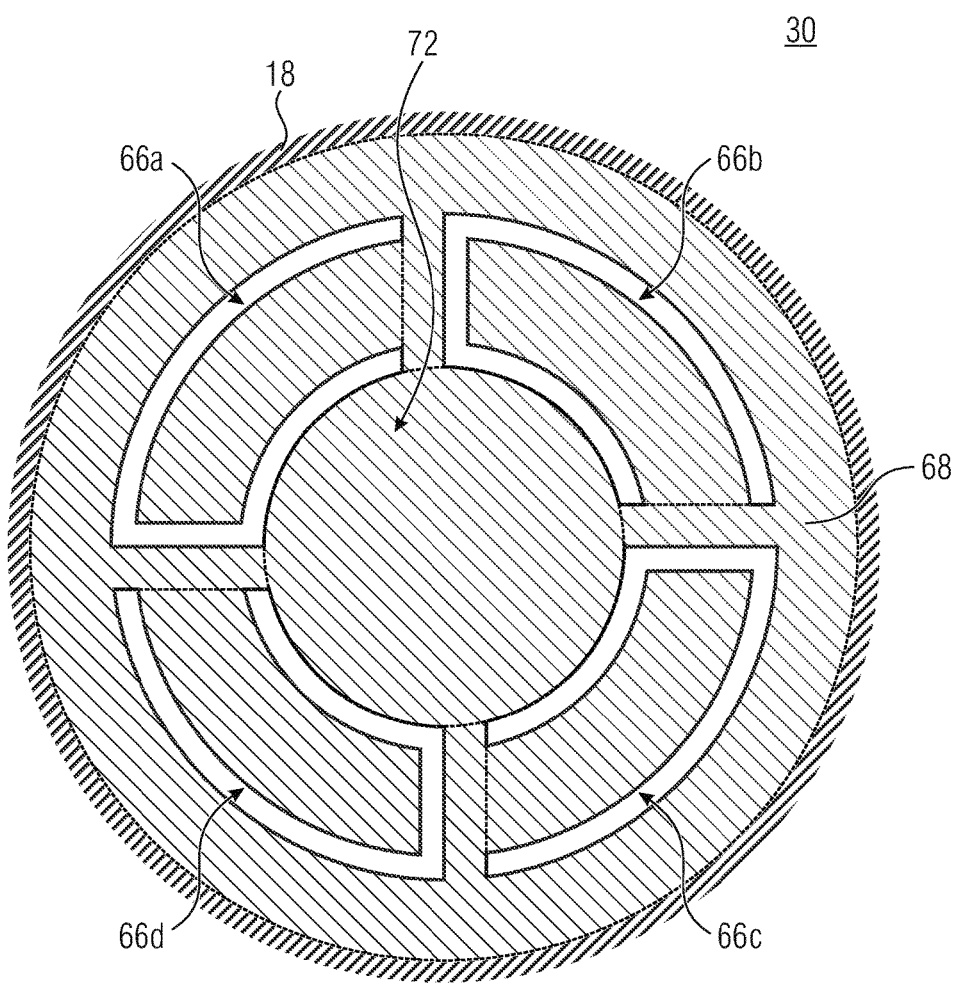
FIG. 8 is a top view of a round electrostatic actuator having four cantilevers.

FIG. 8 shows a top view of an apparatus 30 having a round electrostatic actuator and four symmetrically disposed cantilevers 66a-d, each describing a quarter of a circular arc. The cantilevers 66a-d include a mechanical preload analogous to FIG. 1, whereas an outer area 68 as well as an inner area 72 of the actuator are implemented without mechanical preload, such that the outer area 68 and the inner area 72 are formed in a planar manner analogous to FIG. 1. The cantilevers 66a-d are deflected from the plane of the actuator and each of them partially closes, at four contact points, a gap between an electrode disposed on the cantilevers 66a-d and an opposite static electrode analogous to FIG. 1a. By separately controlling the electrodes of the cantilevers 66a-d, tilting of the inner area 72 can be obtained, whereby an object disposed on the inner area 72 can be tilted in space or can be moved in space when simultaneously controlling the cantilevers 66a-d.

Figure 9A:
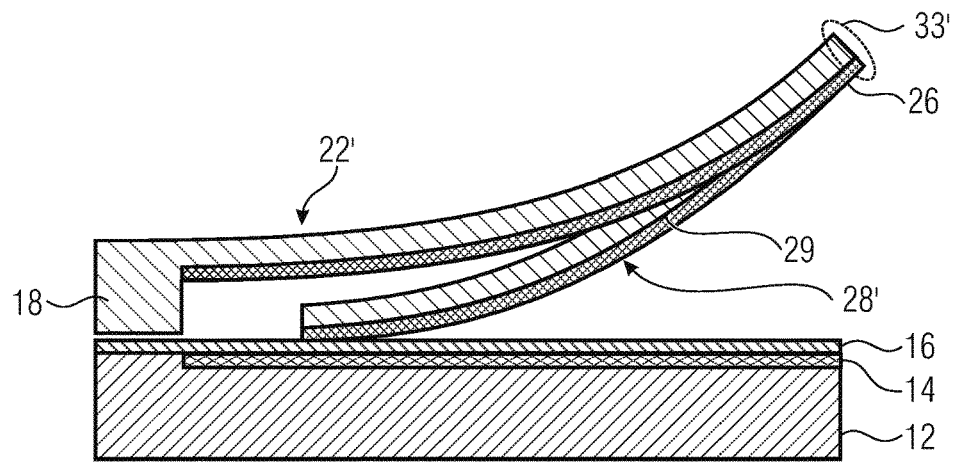
Figure 9B:
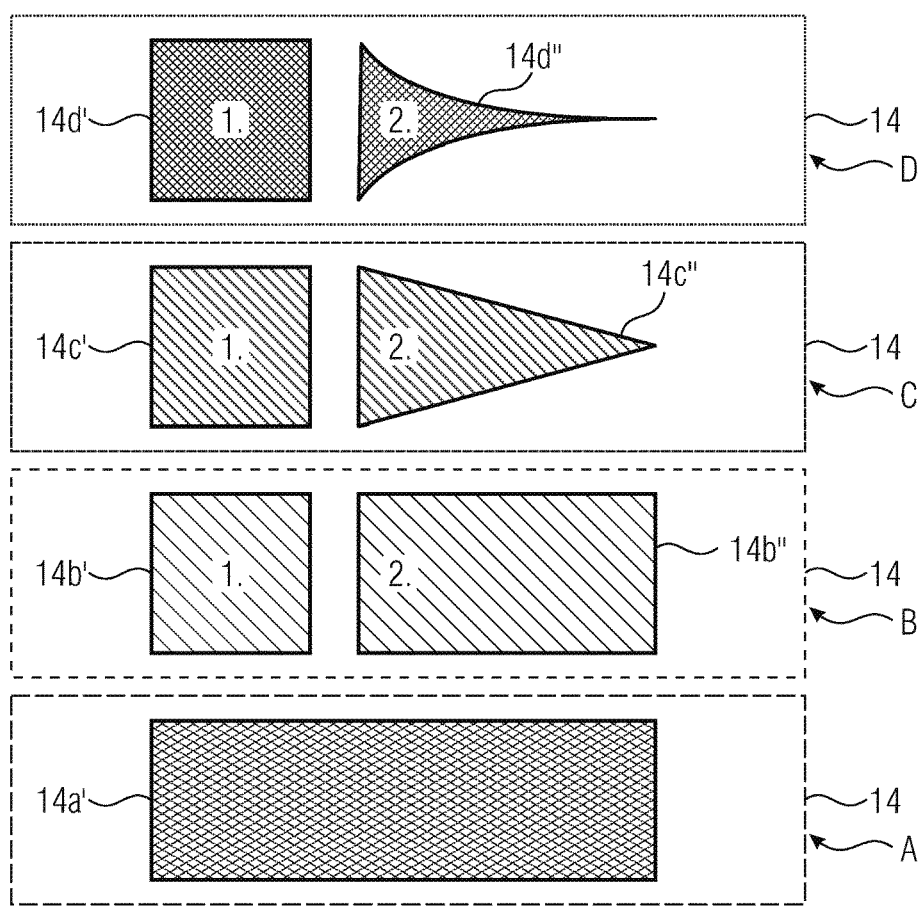
FIG. 9b shows illustrations of different exemplary electrode geometries.
Figure 9C:
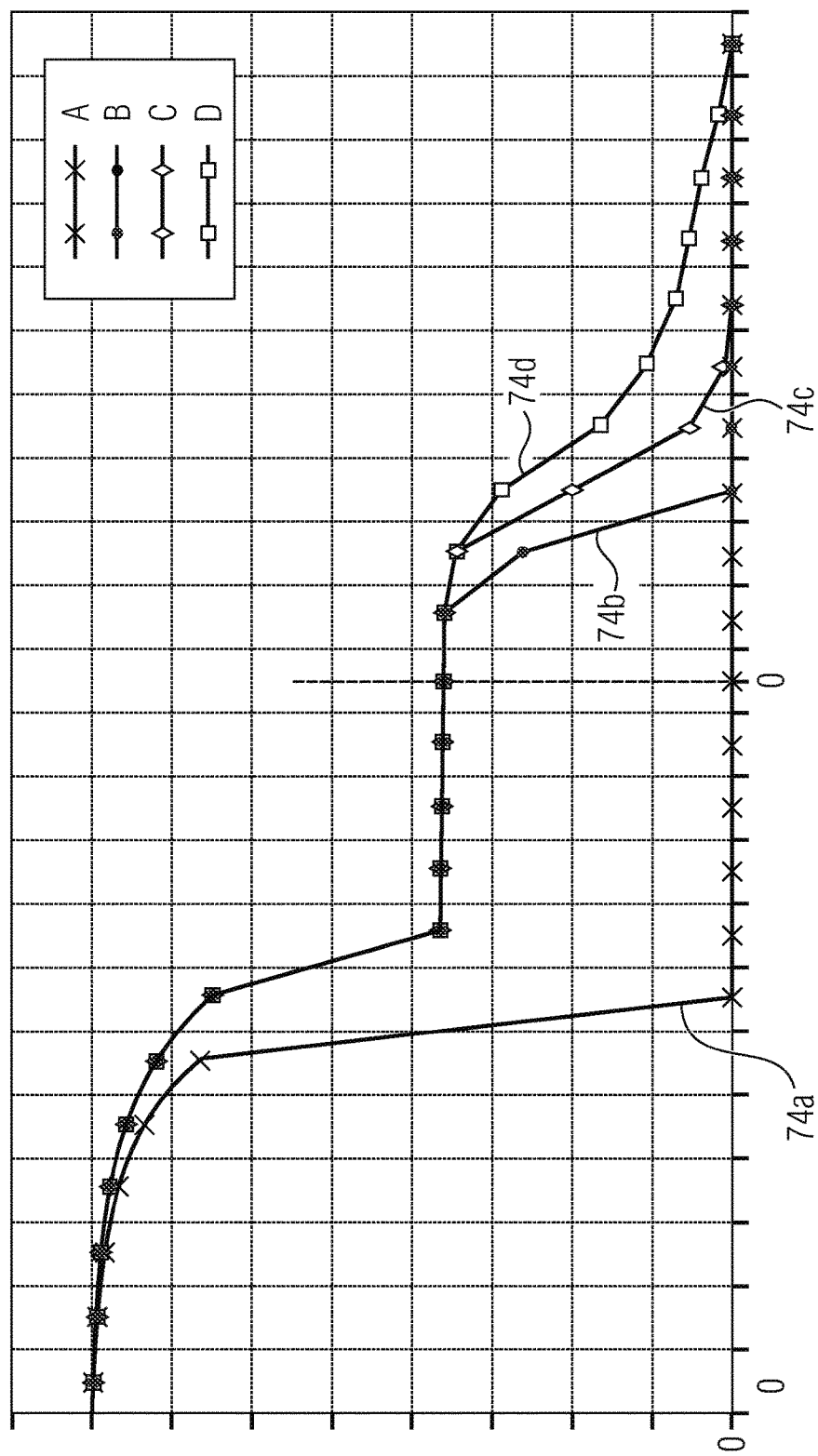
FIG. 9c shows graphs with exemplary actuator deflections of the different electrode geometries of FIG. 9b.

FIG. 9a shows a side view of an electrostatic actuator analogous to FIG. 4a, for which FIG. 9c shows deflections for different variations A-D of the stationary electrode 14. FIG. 9b shows top views of four implementations of the stationary electrode 14 each having one or two segments, wherein each segment can be independently provided with an electric voltage.

The behavior of the different implementations of the stationary electrode 14 with respect to the deflection curve of the actuator is illustrated in the following FIG. 9c. In variation A, the stationary electrode 14 is integrally formed by a segment 14'a across the whole expansion. In variation B, the stationary electrode 14 includes the two segments 14b' and 14b", wherein each of the two segments 14b' and 14b" can be independently provided with an electric voltage. Both segments 14b and 14b" are formed in a rectangular manner, wherein both segments 14b' and 14b" include the same lateral expansion and segment 14b" includes a greater axial expansion than segment 14b'. In variation C, the stationary electrode 14 includes two segments 14c' and 14c", wherein segment 14c" is formed in a triangular manner with respect to segment 14b" and comprises a taper towards an end facing away from the segment 14c'. In variation D, a segment 14d" includes a taper analogous to the segment 14c", wherein the taper has a nonlinear concave curve. Segments 14b', 14c' and 14d' have an identical shape. Segments 14b', 14c' and 14d' are disposed adjacent to the fixed clamping 18, wherein segments 14b", 14c" and 14d" are disposed adjacent to the respective segments 14b', 14c' and 14d' in a direction facing away from the fixed clamping 18 and opposite to the bender 22', and wherein a tapered end of the segment 14c" or 14d" is disposed opposite to the deflectable end 33' of the bender 22'.

FIG. 9c shows, qualitatively, for a structure with the variations A-D of the stationary electrode 14 described in FIG. 9b, the respective obtainable deflections of an electrostatic actuator including the electrodes in dependence on the applied control voltages. The ordinate of the graph shows the distance of the deflectable end of the bender 22' of FIG. 9a to the isolation layer 16. The control voltages are plotted on the abscissa, wherein in a first portion of the abscissa, starting from the ordinate, an increasing control voltage of segments 14a', 14b', 14c' and 14d' is plotted, and in a second portion of the abscissa illustrated at the dotted line by the abscissa value 0, a connection of the second segments 14b", 14c" and 14d".

The curve of a first graph 74a shows the deflection of the deflectable end 33' for the variation A of the stationary electrode 14. With the control voltage incrementally rising from 0, the deflection of the deflectable end 33' of the bender 22' increasingly reduces in the first five increments with respect to the isolation layer 16, to show, in the following increment of the control voltage, an abrupt deflection of 0, which corresponds to an occurrence of the pull-in effect. Resolution of the travel between the fifth and sixth increment is not possible when considering the increment of the control voltage. Accordingly, the maximum control voltage for an analog deflection of the actuator with the variation A of the stationary electrode 14 is limited to a voltage range of 0 up to the occurrence of the pull-in effect.

The further graphs 74b, 74c and 74d lie above one another in the first portion of the abscissa, since in this area merely the respective identically formed segments 14b', 14c' and 14d' are provided with a voltage with respect to bender electrode 26 or cantilever electrode 29, whereas the segments 14b", 14c" and 14d", which have different geometrical shapes, are not yet provided with any voltage. It can be seen that a deflection of the deflectable end 33' comparable to the fifth increment of the control voltage of the segment 14a' is only obtained in the sixth increment of the control voltage. In that case, the actuator deflection for this travel can have a finer resolution, since the attracting force between bender 22' and stationary electrode 14 for the variations B-D is merely generated in the area of the segment 14b', 14c' or 14d'. If the voltage is increased further by one increment, a strong drop of the actuator deflection shows, similar to the graph 74a, wherein the actuator deflection remains at a deflection approximately corresponding to half of the original deflection, even with further increased voltage and the occurrence of the pull-in effect is prevented across the whole travel. A further increase of the applied voltage at the segments 14b'-14d' does not show any visible change of the actuator deflection. In the further curve of the abscissa, the voltage at the segments 14b'-d' is kept constant and the voltage at the second segments 14b"-d" is increased incrementally.

It can be seen that in graph 74b, showing the deflection of the actuator including the stationary electrode 14 in variation B, the actuator deflection with increased voltage at the segment 14b" in the second increment is reduced to approximately one third of the original deflection, to show, in the next increment of the control voltage at the segment 14b" the occurrence of the pull-in effect. In comparison, graph 74c shows a continuous curve of the actuator deflection in direction 0. Due to the triangular geometry of the segment 14c', the attracting force locally induced between the stationary electrode 14 and the opposing electrode decreases with a tapering lateral expansion of the segment 14c, such that, with identical electric voltage, the electrostatic force between stationary electrode 14 and cantilever electrode 29 or bender electrode 26 varies locally.

For the fifth increment of the control voltage, at the segment 14c", graph 74c has a low actuator deflection close to but greater than 0, which shows an absence of the pull-in effect. Only in the further curve of the control voltage of the segment 14c", the travel of the actuator is reduced to 0, but this is performed in small increments and hence contrary to the sudden occurrence of the pull-in effect.

Due to the nonlinear taper of segment 14d", graph 74d shows a completely resolvable travel across the whole voltage range, wherein a greater electric voltage can be applied up to the reduction of the travel to 0, wherein the available travel can have a finer resolution. Reason for this is the lateral expansion of the segment 14d" tapering in a nonlinear manner with respect to the segment 14c".

Depending on the necessitated characteristic curve of the electrostatic actuator, due to the geometries of the first segments 14a'-d' and/or the second segments 14b"-d" and possible additional electrode segments, any characteristic curve of the travel of the electrostatic actuator can be defined.

Alternatively or additionally it is possible that instead of or apart from a division of the stationary electrode into segments, the cantilever and/or bender electrode is divided into two or more segments for defining an adaptation of the travel of the actuator in dependence on the applied electric voltage.

Changing the lateral expansion of the electrodes allows an adaptation of the force generated between the two electrodes depending also on the geometry of the electrodes and hence the resulting deflection of the electrostatic actuator. In particular, non-linearities of the electrostatic force generation can be considered or compensated by the geometry, in addition to the reduction of the gap between cantilever and stationary electrode.

Alternatively or additionally, mechanical preloads and the resulting pre-curved bender structures can be used for translating, via a lever, the deflection generated by the actuator into a greater deflection.

FIG. 10 shows an apparatus 40 wherein, on a bender 76, a beam element 78 having a similar expansion as the bender 76 is disposed offset at a deflectable end 83 of the bender 76.

Figure 10A:
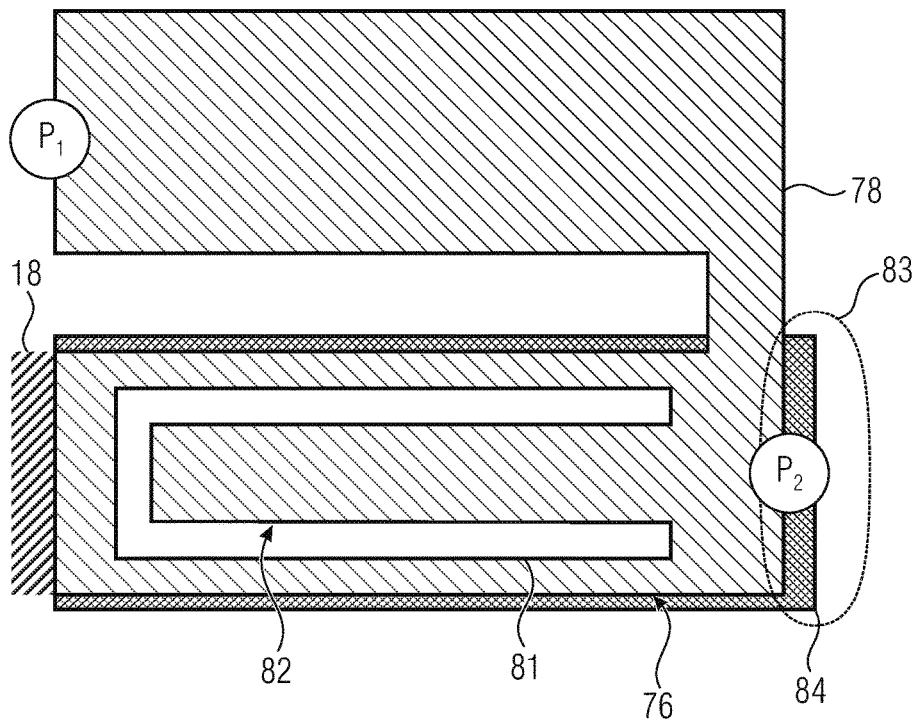
FIG. 10a is a top view of an electrostatic actuator in a non-deflected state at the deflectable end of which a beam element is disposed.

FIG. 10a shows a top view of an apparatus 40 in an electric voltage-free non-deflected state. An electrode 84 is disposed on a side of the bender 76 facing the stationary electrode 14 as well as a deflector 82 defined by a recess 81. The deflectable end 83 of the bender 76 facing away from the fixed clamping 18 defines the point $P_2$. The beam element 78 includes a curvature, such that in a side view of the apparatus the beam element 78 is disposed approximately congruently with the bender 76, as shown in FIG. 10b, wherein the deflectable end 83 of the bender 76 is connected to a clamped end of the beam element 78.

Figure 10B:
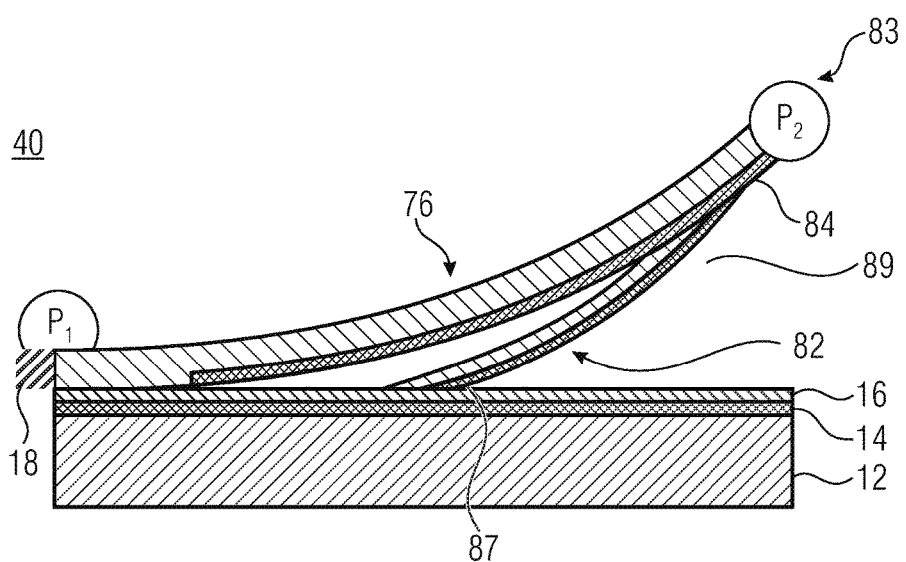

FIG. 10b shows the apparatus 40 of FIG. 10a in a side view. A portion of the electrode 84 is disposed on a cantilever 82, such that a cantilever electrode and a bender electrode are integral and have an identical electrical potential. The cantilever 82 partially closes a gap 89 between the stationary electrode 14 and the cantilever electrode at a contact point 87. A deflectable end of the beam element 78 is designated by point $P_1$ and disposed opposite to the clamped end of the beam element.

Figure 10C:
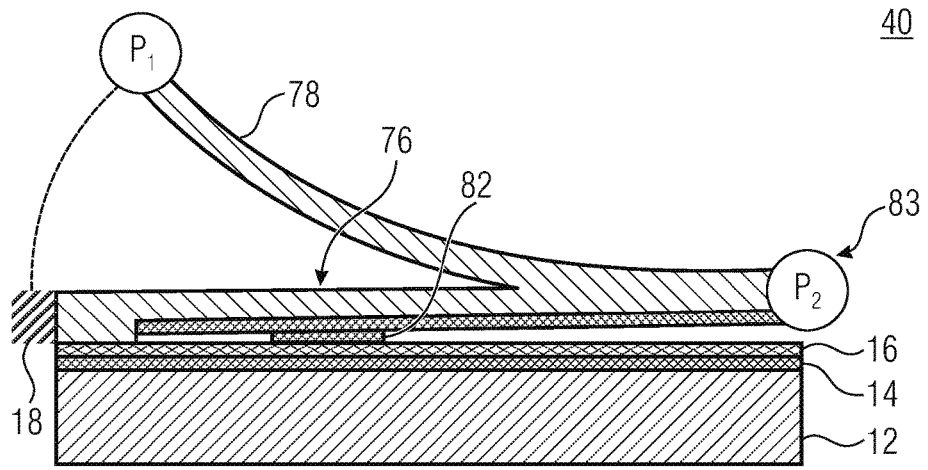
FIG. 10c is a side view of the electrostatic actuator analogous to FIG. 10b in a deflected state.

FIG. 10c shows a side view analogous to FIG. 10b of the apparatus 40 in a deflected state. Compared to FIG. 10a, the deflection of the bender 76 results in a decreased distance between the point $P_2$ and the stationary electrode 14, as described in the above embodiments. Simultaneously, the bender 76 is no longer congruent with the beam element 78 with regard to the side view, such that the curvature of the beam element 78 has the effect that the point $P_1$ has a greater distance to the plane of the stationary electrode 14 than in the non-deflected state.

Figure 10D:
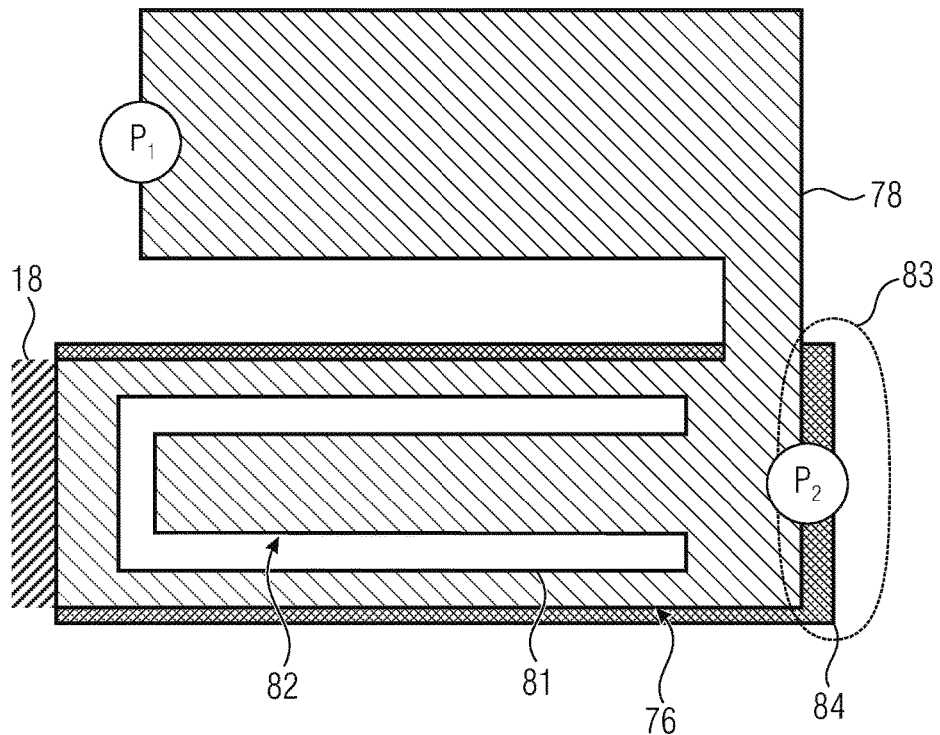
FIG. 10d is a top view of the electrostatic actuator of FIGS. 10a-c in the deflected state analogous to FIG. 10c.

FIG. 10d shows a top view of the apparatus 40 in the deflected state analogous to FIG. 10c. Compared to FIG. 10a and with respect to the top view, the lateral expansion of the beam element 78 is reduced.

By the arrangement of the beam element 78, the travel of the actuator is deflected by the lever principle such that on the one hand, instead of reducing a distance between bender electrode and static electrode with increasing control voltage, a travel between point $P_1$ of the beam element 78 and the plane of the stationary electrode 14 increasing with increasing control voltage can be used. At the same time, by the independent definition of the axial expansions of the bender 76 and the beam element 78, according to the lever principle, a force-distance transmission can be defined which allows an increase of the obtainable travel and/or an increase of an actuating power.

The stroke of the electrostatic actuator can be increased by the lever transmission. Functional elements, for example solid springs holding polymer lenses or micro mirrors can be provided at the point $P_1$. According to the above embodiments, the deflection behavior of the bender can be adapted by shape adjustments of the electrodes as needed.

Figure 11A:
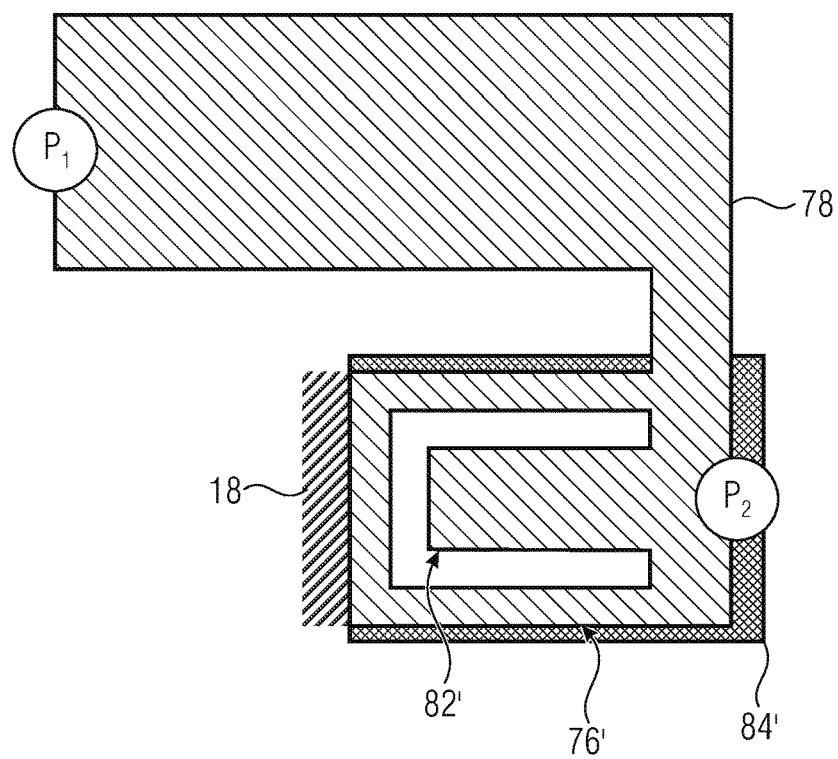
FIG. 11a is a top view of the electrostatic actuator analogous to FIG. 10a, wherein the bender has a lower axial expansion with respect to the beam element.

FIG. 11a shows a top view of an apparatus 50 having a 76' bender and a beam element 78' analogous to apparatus 40, wherein the axial expansion of the bender 76' is shortened with respect to the axial expansion of the beam element 78'.

Figure 11B:
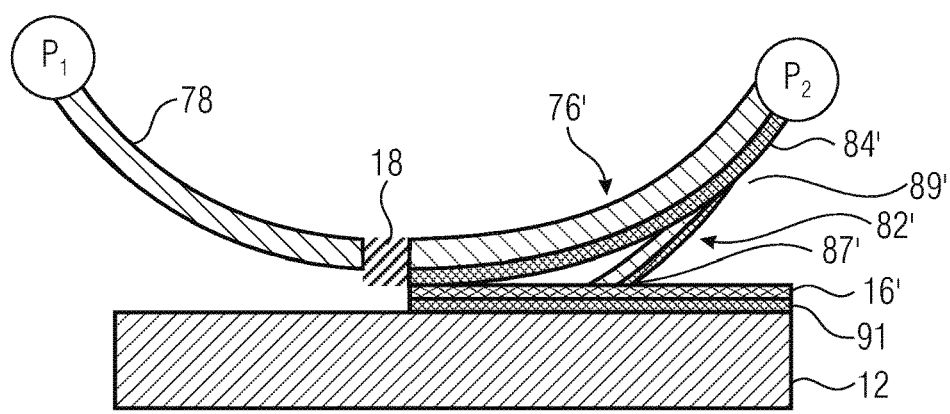
FIG. 11b is a side view of the electrostatic actuator of FIG. 11a analogous to FIG. 10b.

FIG. 11b shows a side view of the apparatus 50 in a non-deflected state, wherein analogous to the apparatus 40, the bender 76' and the beam element 78 run congruently along the curve of the bender 76' towards the point $P_2$. At a contact point 87', a cantilever 82' partially closes a gap 89' between an electrode 84' and a stationary electrode 91.

Starting from point $P_2$, the beam element 78 runs in the direction of the fixed clamping 18 parallel to the bender 76' in the viewing plane, however, in contrast to the apparatus 40, the same is disposed such that its curve runs beyond the fixed clamping 18, such that the same includes a greater axial expansion than the bender 76'.

Figure 11C:
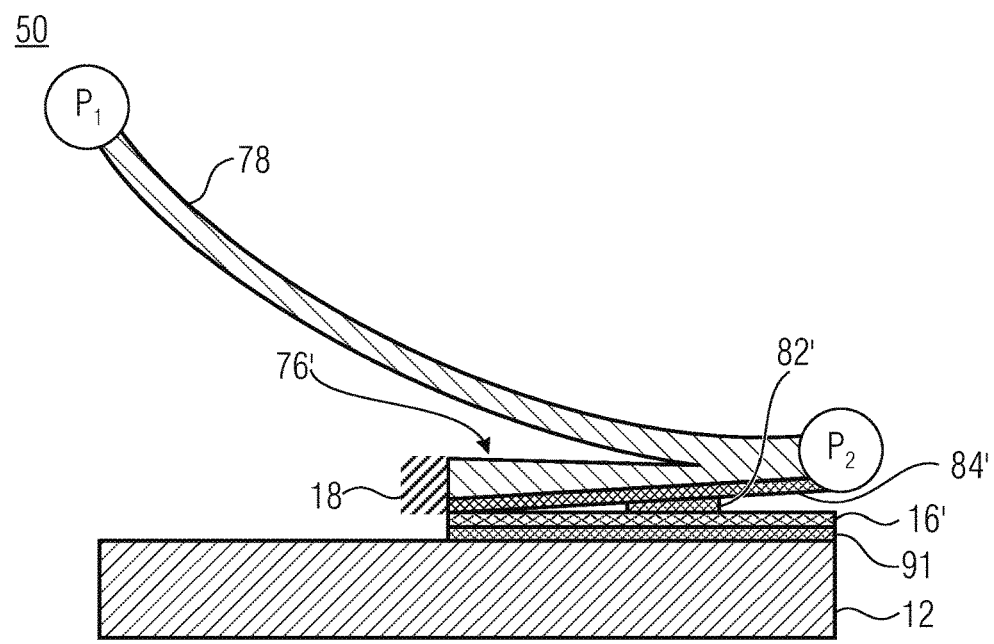
FIG. 11c is a side view of the electrostatic actuator analogous to FIG. 11b of the electrostatic actuator in a deflected state.

FIG. 11c shows a side view of the apparatus 50 in a deflected state. Analogous to FIG. 10c, the point $P_2$ is moved adjacent to the stationary electrode 91, which results in an increase of a distance of point $P_1$ to the substrate 12. Due to the greater axial expansion of the beam element 78 with respect to the axial expansion of the bender 76' at identical curvatures, the increase of the distance of the point $P_1$ to the substrate 12 is greater than the decrease of the distance of the point $P_2$ to the stationary electrode 91.

Figure 11D:
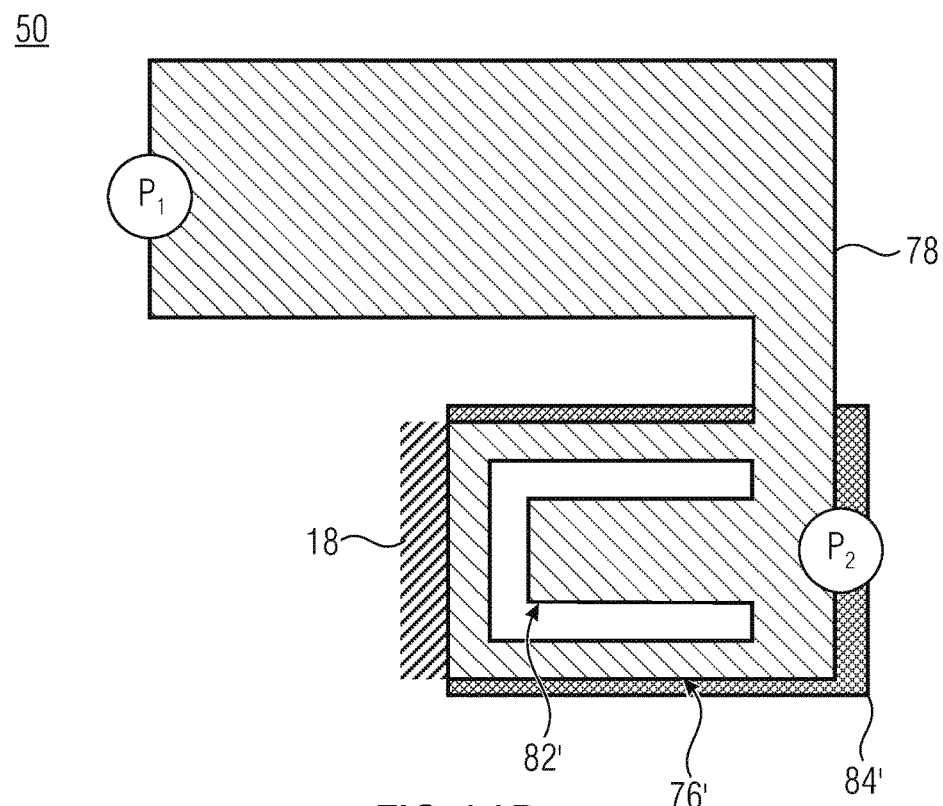
FIG. 11d is a top view of the electrostatic actuator analogous to FIG. 11a in a deflectable state analogous to FIG. 11c.

FIG. 11d shows the deflected state of the apparatus 50 in a top view, wherein due to the deflection analogous to FIG. 10d a reduced axial expansion of the beam element 78 with respect to the viewing plane is shown.

According to the above explanations, by defining a ratio of the axial expansion of the bender or the beam element, lever transmission of the actuator force and/or the actuator travel can be defined.

FIG. 12 shows an apparatus 60 which extends the apparatus 50 of FIG. 11 in that a beam electrode 86 is disposed on a portion of the beam element 78 starting from a deflectable end of the beam element 78.

Figure 12A:
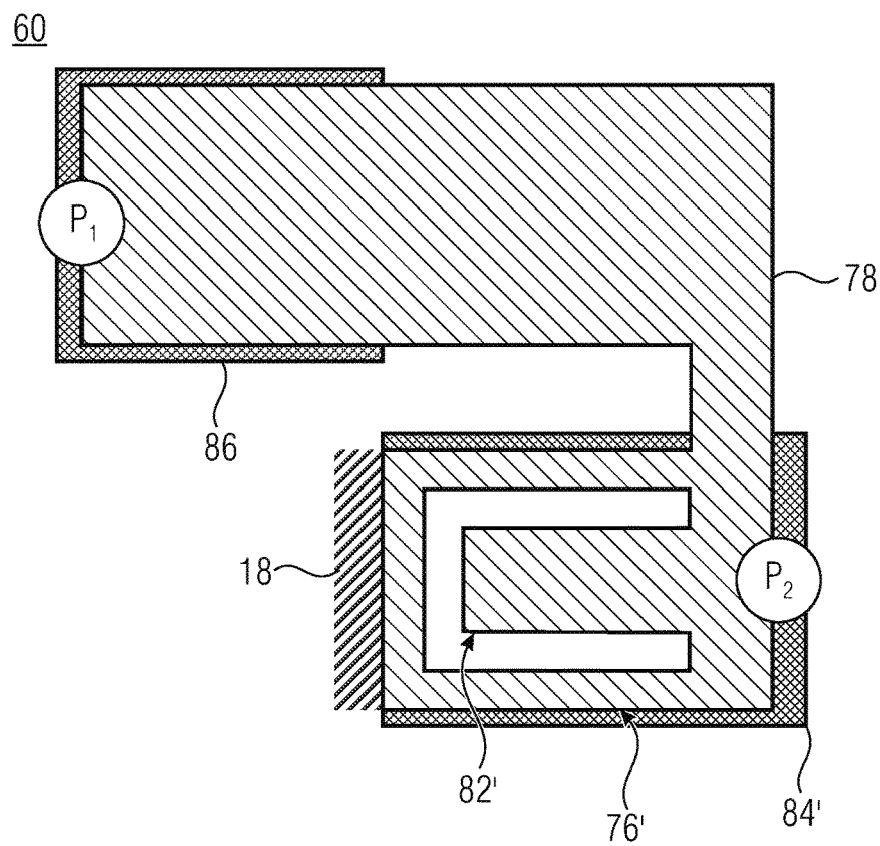
FIG. 12a is a top view of an electrostatic actuator analogous to FIG. 11a, wherein a beam electrode is disposed in an area of the beam element.

FIG. 12a shows a top view of the apparatus 60. Starting from the deflectable end of the beam element 78, the beam electrode 86 is disposed with an axial expansion from a deflectable end up to approximately the area of the fixed clamping 18.

Figure 12B:
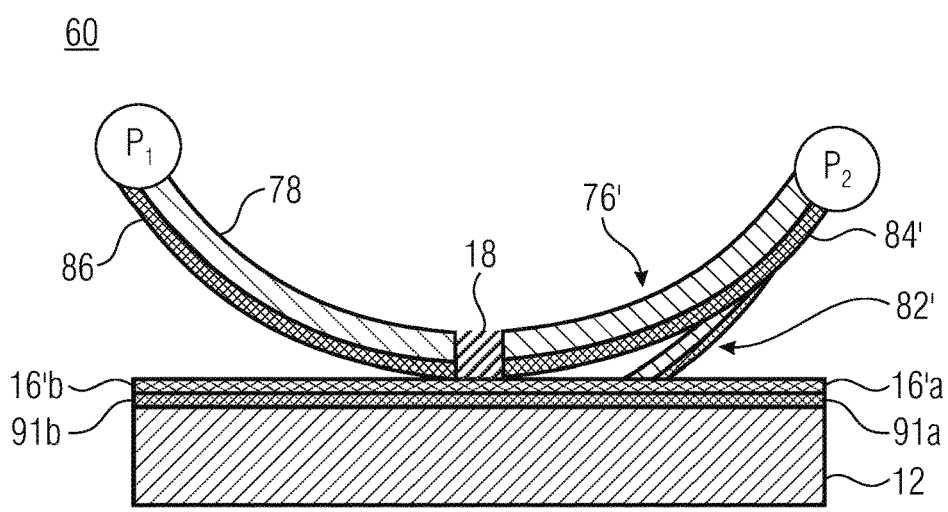
FIG. 12b is a side view of the actuator according to FIG. 12a analogous to FIG. 11b.

FIG. 12b shows a side view of the apparatus 60 analogous to the side view of FIG. 11b, wherein opposite to the beam electrode 86, on the substrate 12, a stationary electrode 91b is disposed, which is covered by an isolation layer 16'b, wherein the isolation layer 16'b prevents electric contact of the beam electrode 86 with the stationary electrode 91b. The stationary electrode 91a corresponds to the stationary electrode 91 of FIG. 11 and is disposed opposite to the electrode 84' and covered by the isolation layer 16'a corresponding to the isolation layer 16' of FIG. 11.

Due to the parallel curve of the curvatures of the bender 76' and the beam element 78, the distance between beam electrode 86 and the stationary electrode 91b is at a minimum in the area along the lateral expansion of the fixed clamping 18.

Figure 12C:
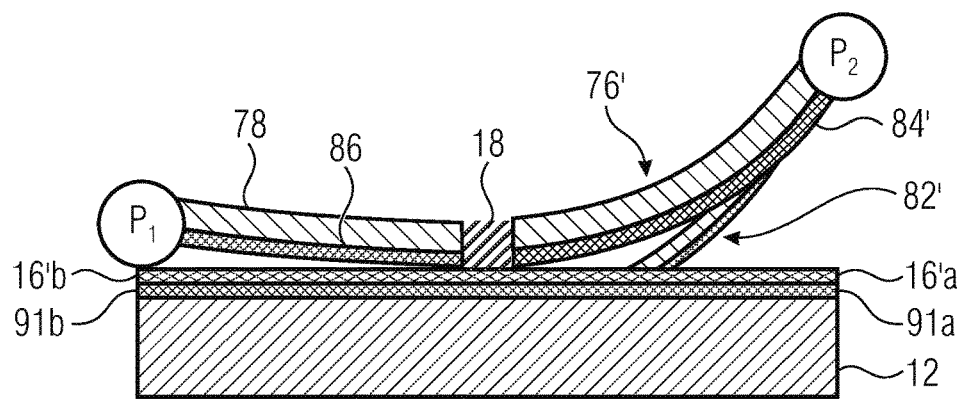
FIG. 12c is a side view of the actuator analogous to FIG. 12b, wherein the additionally disposed beam element is deflected.

FIG. 12c shows a side view of the apparatus 60 where an electric voltage is applied between the beam electrode 86 and the stationary electrode 91b. The resulting attracting force between the beam electrode 86 and the stationary electrode 91b has the effect that the deflectable end of the beam element is deflected in the direction of the stationary electrode 91b and that the distance between the point $P_1$ and the stationary electrode 91b is reduced.

Figure 12D:
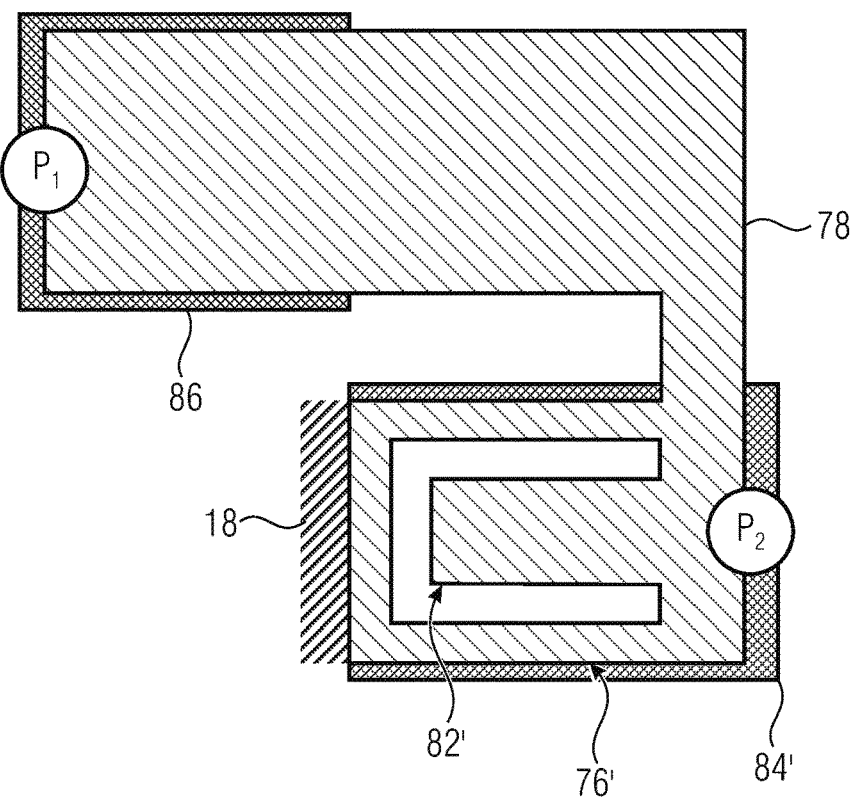
FIG. 12d is a top view of the electrostatic actuator analogous to FIG. 12a in a deflected state analogous to FIG. 12c.

FIG. 12d shows a top view of the apparatus 60 in the state of FIG. 12c, wherein an electric voltage is applied between the beam electrode 86 and the stationary electrode 91b. In the plane of the top view, the axial expansion of the beam element 78 is increased by the deflection described in FIG. 12c.

By the arrangement of a beam electrode, the deflection of the point $P_1$ can be adjusted independent of the deflection of the point $P_2$, in particular both a reduction of the distance between the point $P_1$ and the opposite stationary electrode 91b can be adjusted without applying an electric voltage to the electrode 84', and post-adjustment of a beam element deflected according to FIG. 11c can be performed, by adjusting, after the beam element has been deflected, a reduction of the distance $P_1$ to the opposite stationary electrode 91b by applying an electric voltage between the electrodes 86 and 91b.

Alternatively or additionally, the apparatus 60 can be used such that starting from a non-deflected state, in a first step, the actuator is deflected analogous to the apparatus 50 in FIG. 11c and in a second step, applying an electric voltage between the beam electrode 86 and the stationary electrode 91 results in positioning of the point $P_1$. In this case, the direction of movement of the point $P_1$ is analog to a deflectable end 33, 33' or 83 of the above embodiments, wherein an increase of the control voltage causes an attracting force and hence a reduction of the travel. By the beam element 78, the usable travel of the actuator with respect to embodiments without beam elements is enlarged. Additionally, the point $P_1$ is movable in a direction facing the stationary electrode 91b and in an opposite direction.

In alternative embodiments, stationary electrodes 91a and 91b are integrally formed. This offers advantages, in particular during a production procedure, when the stationary electrode includes, in the later operation, the reference potential of the electrostatic drive or the ground potential, and hence serves both as reference point with respect to the electrodes disposed on the benders and as reference potential with respect to the beam electrodes.

In further embodiments, the isolation layer 16'a is formed integrally with the isolation layer 16'b.

While in the above embodiments the electrodes have been disposed on benders, cantilevers or beam elements, according to alternative embodiments, it is also possible that the electrodes are embedded into the material of the benders, cantilevers or beam elements, in particular when benders, cantilevers or beam elements are formed of polymer materials. According to these embodiments, an isolation layer is formed between two opposite electrodes of the material of the benders, cantilevers or beam elements, such that the arrangement of a further isolation layer is omitted.

While in the above embodiments electrostatic actuators have been described such that applying an electric voltage and hence an electric field between two electrodes results in attracting forces between the electrodes and hence in a reduction of the distance between the electrodes, it is obvious that an electric voltage can also be applied between the electrodes such that repulsing forces result between the electrodes and hence an increase of the distance between the electrodes.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Electrostatic actuator, comprising:
a stationary electrode;
a fixedly cantilevered bender,
wherein the bender comprises a cantilever with a cantilever electrode disposed opposite to the stationary electrode in an overlapping area;
wherein the cantilever comprises, in an idle state, a first end disposed in the plane of the bender and a second end deflected out of a plane where the bender is disposed in the direction of the stationary electrode, to effect, when applying an electric field, a deformation of the cantilever electrode or the bender.

2. Apparatus according to claim 1, wherein an insulating spacer is disposed at least partly between the cantilever electrode and the stationary electrode.

3. Apparatus according to claim 1, wherein the insulating spacer is disposed on the cantilever electrode or the stationary electrode.

4. Apparatus according to claim 1, wherein the stationary electrode comprises a portion on which the cantilever electrode is supported.

5. Apparatus according to claim 1, wherein a gap disposed between the cantilever electrode and the stationary electrode is partially reduced in an area of the cantilever electrode.

6. Apparatus according to claim 1, wherein the geometry of the cantilever electrode or the stationary electrode is implemented to comprise a linearized ratio of voltage applied between the electrodes and the resulting deformation of the bender or the cantilever electrode.

7. Apparatus according to claim 1 comprising a spring structure disposed on the deflectable end of the bender disposed opposite to the fixed clamping.

8. Apparatus according to claim 1, wherein the bender comprises several cantilever electrodes.

9. Apparatus according to claim 1, wherein the stationary electrode comprises at least two partial electrodes.

10. Apparatus according to claim 1, wherein the cantilever electrode comprises at least two partial electrodes.

11. Apparatus according to claim 9, wherein one or several of the partial electrodes comprise a variable lateral expansion.

12. Apparatus according to claim 1, wherein a beam element is disposed on the deflectable end of the bender, which runs in one portion laterally adjacent to and along the bender.

13. Apparatus according to claim 12, wherein the beam element comprises a curvature along an axial curve.

14. Apparatus according to claim 12, wherein the beam element comprises a lever electrode.

15. Apparatus, comprising:
a first electrostatic actuator according to claim 1;
a second electrostatic actuator according to claim 1,
wherein the first and the second electrostatic actuators are disposed such that the deflectable ends of the benders are opposite; and
a spring structure disposed between the deflectable ends of the benders and connecting the deflectable ends.

16. Apparatus according to claim 15, wherein a functional element is disposed on the spring structure.

17. Method for producing an electrostatic actuator, comprising:
disposing a stationary electrode;
disposing a fixedly cantilevered bender;
wherein the bender comprises a cantilever with a cantilever electrode, which is disposed opposite to the stationary electrode in an overlapping area;
wherein the cantilever comprises, in an idle state, a first end disposed in the plane of the bender and a second end deflected out of a plane where the bender is disposed in the direction of the stationary electrode, to effect, when applying an electric field, a deformation of the cantilever electrode or the bender.

* * * * *